(12) United States Patent
Shankar

(10) Patent No.: US 11,144,082 B2
(45) Date of Patent: Oct. 12, 2021

(54) GATE DRIVER CIRCUIT FOR REDUCING DEADTIME INEFFICIENCIES

(71) Applicant: TEXAS INSTRUMENTS INCORPORATED, Dallas, TX (US)

(72) Inventor: Krishnamurthy Ganapathi Shankar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/834,362

(22) Filed: Mar. 30, 2020

(65) Prior Publication Data

US 2020/0356129 A1 Nov. 12, 2020

Related U.S. Application Data

(62) Division of application No. 16/406,104, filed on May 8, 2019, now Pat. No. 10,642,306.

(51) Int. Cl.
| | |
|---|---|
| *G05F 3/26* | (2006.01) |
| *H02H 7/12* | (2006.01) |
| *H02M 3/07* | (2006.01) |
| *H03K 17/693* | (2006.01) |
| *H03K 17/62* | (2006.01) |
| *H02P 7/03* | (2016.01) |

(52) U.S. Cl.
CPC ............ *G05F 3/267* (2013.01); *H02H 7/1213* (2013.01); *H02M 3/07* (2013.01); *H02P 7/04* (2016.02); *H03K 17/62* (2013.01); *H03K 17/693* (2013.01)

(58) Field of Classification Search
CPC .. G05F 3/267; G05F 3/26; G05F 3/262; H02P 7/04; H03K 17/62; H03K 17/693; H02H 7/1213; H02M 3/07
See application file for complete search history.

(56) References Cited

U.S. PATENT DOCUMENTS 10,432,199 B1 * 10/2019 Zhang ............ H03K 19/018507
2019/0245524 A1  8/2019 Kim

* cited by examiner

*Primary Examiner* — Jung Kim
(74) *Attorney, Agent, or Firm* — Valerie M. Davis; Charles A. Brill; Frank D. Cimino

(57) ABSTRACT

A driver circuit comprises a first buffer receiving a control signal, and a first transistor coupled to first buffer and an output. A second transistor is coupled to a first current mirror and the output. A third transistor is coupled to the output and an inverter. A fourth transistor receives the inverter's output at its control input and is coupled to the output. A fifth transistor is coupled to third transistor. The second, third, and fifth transistors receive supply voltage at their respective control inputs. A sixth transistor receives the control signal's inverse at its control input and is coupled to fifth transistor and a second current mirror. A current source is coupled to second current mirror and a second buffer. A seventh transistor receives the second buffer's output at its control input and is coupled to first buffer. An eighth transistor is coupled to first buffer and seventh transistor.

20 Claims, 7 Drawing Sheets

US 11,144,082 B2

GATE DRIVER CIRCUIT FOR REDUCING DEADTIME INEFFICIENCIES

CROSS REFERENCE TO RELATED APPLICATION(S)

This divisional application claims priority to U.S. patent application Ser. No. 16/406,104, filed May 8, 2019, which application is incorporated herein by reference in its entirety.

BACKGROUND

H bridge drivers include two high side transistors and two low side transistors, and are configured such that each high side transistor s in series with a respective low side transistor and a load is coupled to the nodes between the pairs of high side and low side transistors. Each pair of high side and low side transistors is called a half bridge. A gate driver circuit converts a control signal to a power signal that can efficiently turn on and off each transistor in the H bridge driver. To prevent shoot-through conditions within a half bridge during transitions from high to low or low to high, dead time is inserted between turning off of one transistor and turning on of the other. The length of the dead time is often equal to the time required to turn on or turn off a transistor in the half bridge driver. However, dead time limits the operating frequency of the H bridge driver and allows power dissipation through transistors in the H bridge driver.

Some gate driver circuits reduce power dissipation during dead time by turning the transistor on and off more quickly. This may increase the efficiency of the H bridge driver, but at the cost of creating electromagnetic interference (EMI) in the integrated circuit (IC), disrupting operation of other circuits in the IC. Some gate driver circuits balance the need for quick turn on and turn off times with controlled EMI by implementing comparators to detect different regions of operation for each transistor during turn on and turn off, and quickening only the regions that are unlikely to cause EMI. However, these comparators are often area expensive, especially for a high-side gate driver requiring a floating power supply.

SUMMARY

In some implementations, a driver circuit adjusts a drive current during transistor turn on and turn off based on the transistor's region of operation. The driver circuit comprises a first buffer configured to receive a first control signal and a first transistor coupled to the output of the first buffer and an output node of the driver circuit. The driver circuit further comprises a first current mirror, and a second transistor coupled to the first current mirror and the output node. A control input of the second transistor receives a supply voltage. A third transistor is coupled to the output node and an inverter. A control input of the third transistor receives the supply voltage.

A fourth transistor is coupled to the output node, and a control input of the fourth transistor receives the inverter output. A fifth transistor is coupled to the third transistor, and a control input of the fifth transistor receives the supply voltage. A sixth transistor is coupled to the fifth transistor and a second current mirror. A control input of the sixth transistor receives a second control signal, which is the inverse of the first control signal. A current source is coupled to the second current mirror and a second buffer. A seventh transistor is coupled to the first buffer, and a control input of the seventh transistor receives the second buffer's output. An eighth transistor is coupled to the first buffer and the seventh transistor.

The first transistor is configured to turn off in response to a voltage on the output node being greater than a threshold voltage of the transistor driven by the driver circuit, stopping current from flowing from the buffer, through the first transistor, to the output node. The third transistor is configured to turn on in response to a voltage on the output node being greater than the supply voltage at the third transistor's control input, causing the fourth transistor to turn on and allowing current to flow through the fourth transistor to the output node.

The fifth transistor is configured to turn off in response to a voltage on the output node equaling the supply voltage plus a voltage across the third transistor plus a threshold voltage of the fifth transistor, stopping current from flowing from the output node through the fifth transistor. The second current mirror is configured to stop generating current in response to the fifth transistor being kept in an off state. The seventh transistor is configured to turn on in response to the second current mirror generating no current, allowing additional current to flow from the output node, through the buffer and the seventh transistor.

BRIEF DESCRIPTION OF THE DRAWINGS

For a detailed description of various examples, reference will now be made to the accompanying drawings in which.

DETAILED DESCRIPTION

Figure 1:
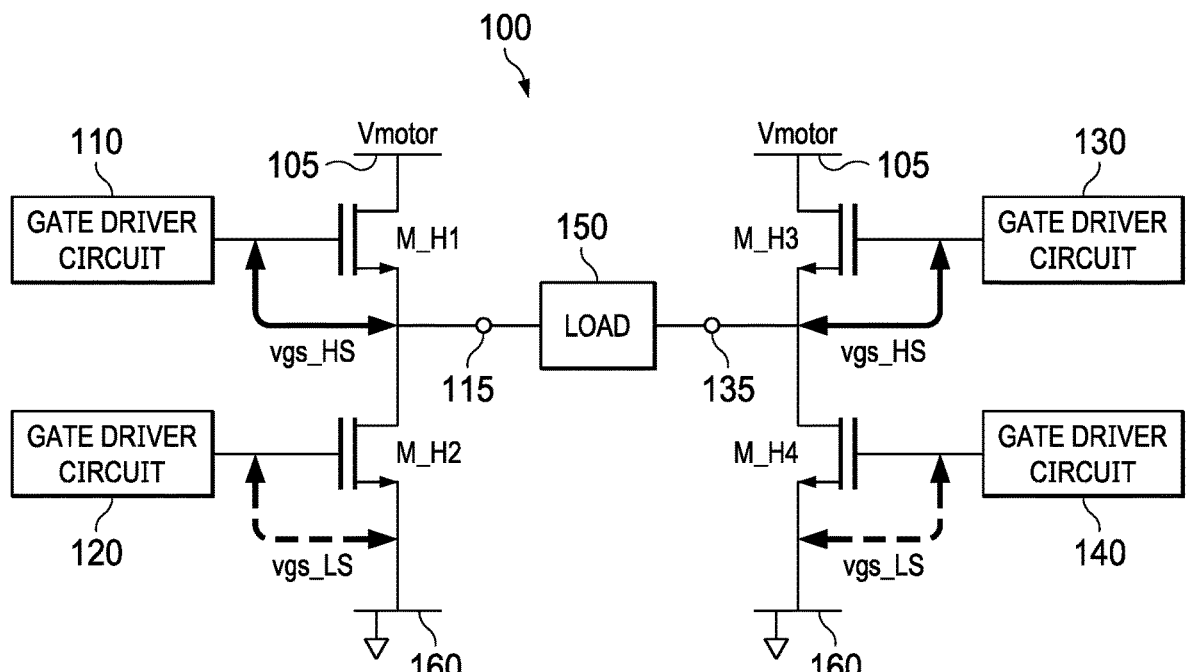
FIG. 1 illustrates an example H bridge motor driver.

As noted above, some gate driver circuits cause electromagnetic interference (EMI) in a circuit (e.g., an integrated circuit (IC)), occupy a large area on an IC, or cause power dissipation in a corresponding H bridge driver circuit. The disclosed example gate driver circuits detect the different regions of operation for each transistor in the corresponding H bridge driver circuit during turn on and turn off, and quicken only the regions that are unlikely to cause EMI, reducing power dissipation in the H bridge driver circuit. The disclosed examples use particular portions of the gate driver circuit during multiple regions of operation and include only two high voltage, area expensive transistors, reducing the total area occupied by the gate driver circuit.

The two high voltage transistors also protect the corresponding H bridge driver circuit in the event of a short circuit by automatically disconnecting the H bridge driver circuit from the charge pump or boost converter supplying the increased supply voltage to the gate terminals of transistors in the H bridge driver circuit.

A disclosed example gate driver circuit includes a first buffer configured to receive a control signal for a particular transistor in the associated H bridge driver circuit. A first transistor is coupled to the output of the first buffer and to an output node of the gate driver circuit and provides a drive current to the gate terminal of the particular transistor in the associated H bridge driver circuit during a first region of operation, while the gate to source voltage of the particular transistor increases to the particular transistor's threshold voltage during turn on. Once the gate to source voltage of the particular transistor increases to the threshold voltage and plateaus while the drain to source voltage of the particular transistor decreases, the first transistor turns off and provides no drive current to the gate terminal of the particular transistor.

A second transistor is coupled to a first current mirror and the output node, and configured to receive the control signal for the particular transistor in the associated H bridge driver circuit. During a second region of operation, while the gate to source voltage of the particular transistor plateaus and the drain to source voltage of the particular transistor decreases during turn on, the second transistor and the first current mirror provide a carefully controlled drive current to the gate terminal of the particular transistor. The drive current is chosen to change the voltage on an output node in the associated H bridge driver circuit at a particular rate, such that the voltage change generates EMI below a particular threshold associated with the IC and reduces noise provided to other circuits on the IC.

A third transistor is coupled to the output node and an inverter, and configured to receive the control signal for the particular transistor in the associated H bridge driver circuit. A fourth transistor is coupled to the output node and a supply voltage node, and configured to receive the output of the inverter. When the voltage on the output node is greater than a voltage of the control signal, the third and fourth transistors turn on, and additional drive current flows from the supply voltage node through the fourth transistor to the output node of the gate driver circuit and the gate terminal of the particular transistor in the associated H bridge driver circuit, completing turn on.

A fifth transistor is coupled to the third transistor and a sixth transistor, and configured to receive the control signal for the particular transistor in the associated H bridge driver circuit. During a fourth region of operation and when the control signal indicated the particular transistor should be turned off, pull-down current flows from the output node through the third and fifth transistor to the sixth transistor and a second current mirror. The sixth transistor is configured to receive the inverse of the control signal for the particular transistor. As the voltage on the output node approaches a voltage of the control signal during a fifth region of operation, the pull-down current through the third, fifth, and sixth transistors decreases until it stops when the voltage on the output node equals the voltage of the control signal and the threshold voltages of the third and fifth transistors, which turn off.

As the pull-down current through the third, fifth and sixth transistors decreases and stops, additional pull-down current flows through the first transistor, the first buffer, and a seventh transistor coupled to the first buffer, carefully controlled to change the voltage on the output node in the associated H bridge driver circuit at a particular rate and to generate EMI below the particular threshold associated with the IC during the fifth region of operation. When the pull-down current through the third, fifth and sixth transistors stops, a current source coupled to the second current mirror provides current to an input of a second buffer. The output of the second buffer is coupled to a gate terminal of an eighth transistor, which is coupled to the seventh transistor and the first buffer. When the current source provides current to the second buffer during a sixth region of operation, the eighth transistor turns on and increases the pull-down current through the first transistor and the first buffer, completing turn off of the particular transistor in the associated H bridge driver circuit.

FIG. 1 illustrates an example H bridge motor driver 100. Although FIG. 1 illustrates an H bridge implemented as a motor driver, H bridges and the gate driver circuits described herein can be used in a variety of applications, including other kinds of power electronics and the like. Example H bridge motor driver 100 includes high-side power field-effect transistors (FETs) M_H1 and M_H3 and low-side power FETs M_H2 and M_H4. A source terminal of M_H1 is coupled to a drain terminal of M_H2 at node 115, forming a half-bridge configuration. A source terminal of M_H3 is coupled to a drain terminal of M_H4 at node 135, forming another half-bridge configuration. The drain terminals of M_H1 and M_H3 are coupled to receive a supply voltage Vmotor at node 105. The source terminals of M_H2 and M_H4 are coupled to receive a common mode voltage at node 160. In some examples, the common mode voltage at node 160 is ground. Node 115 and node 135 form output nodes of the H bridge motor driver 100 and load 150 is coupled to nodes 115 and 135.

The gate terminals of each of M_H1, M_H2, M_H3, and M_H4 are coupled to respective gate driver circuits. The gate terminal of M_H1 is coupled to receive a gate driving current from gate driver circuit 110. The gate terminal of M_H2 is coupled to receive a gate driving current from gate driver circuit 120. The gate terminal of M_H3 is coupled to receive a gate driving current from gate driver circuit 130. The gate terminal of M_H4 is coupled to receive a gate driving current from gate driver circuit 140.

H bridge motor driver 100 includes metal oxide semiconductor field-effect transistors (MOSFETs). M_H1, M_H2, M_H3, and M_H4 are n-type MOSFETs (NMOS) in this example. In other examples, one or more of M_H1, M_H2, M_H3, and M_H4 are p-type MOSFETs (PMOS) or bipolar junction transistors. A bipolar junction transistor includes a base corresponding to the gate terminal, and a collector and an emitter corresponding to the drain and source terminals. The base of a bipolar junction transistor and the gate terminal of a MOSFET are also called control inputs. The collector and emitter of a bipolar junction transistor and the drain and source terminals of a MOSFET are also called current terminals.

Figure 2:
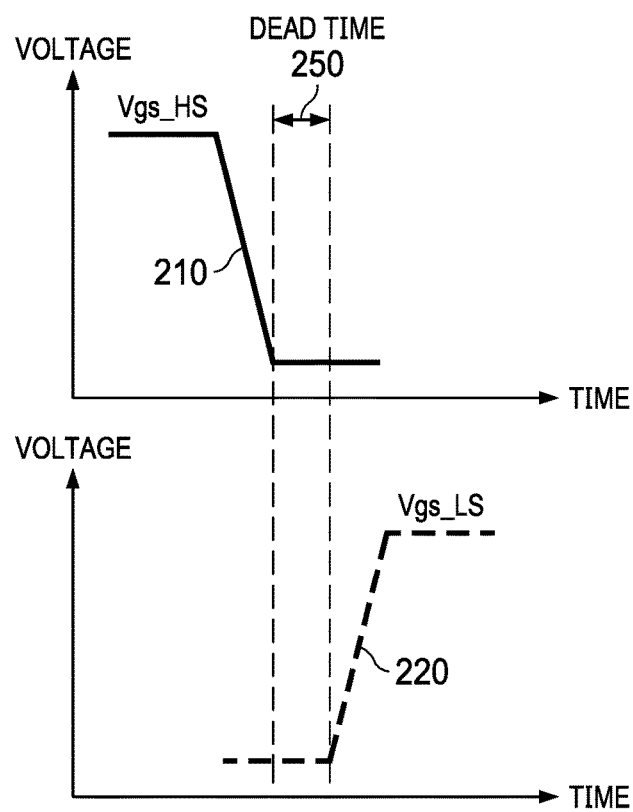
FIG. 2 shows the gate to source voltages of a high side transistor and a low side transistor in an example H bridge motor driver over time.

FIG. 2 shows the gate to source voltage Vgs_HS 210 of M_H1 and the gate to source voltage Vgs_LS 220 of M_H2 in example H bridge motor driver 100 over time. To prevent shoot-through current, the switching scheme controlling M_H1 and M_H2 includes a dead-time 250 in which neither the high side transistor M_H1 nor the low side transistor M_H2 are on. This ensures that M_H1 is fully off before M_H2 turns on. As discussed previously, dead-time 250 slows the switching frequency achievable by H bridge motor driver 100 and increases power dissipated through H bridge motor driver 100. To counter this, some motor drivers increase the slew rate, the speed at which the transistors turn on and off, reducing the propagation delay. Increasing the slew rate may also increase EMI and create noise that interferes with operation of other circuits within the IC. As EMI impacts operation of other circuits, some gate driver circuits prioritize the slew rate and EMI requirements of the IC over switching frequency.

Figure 3A:
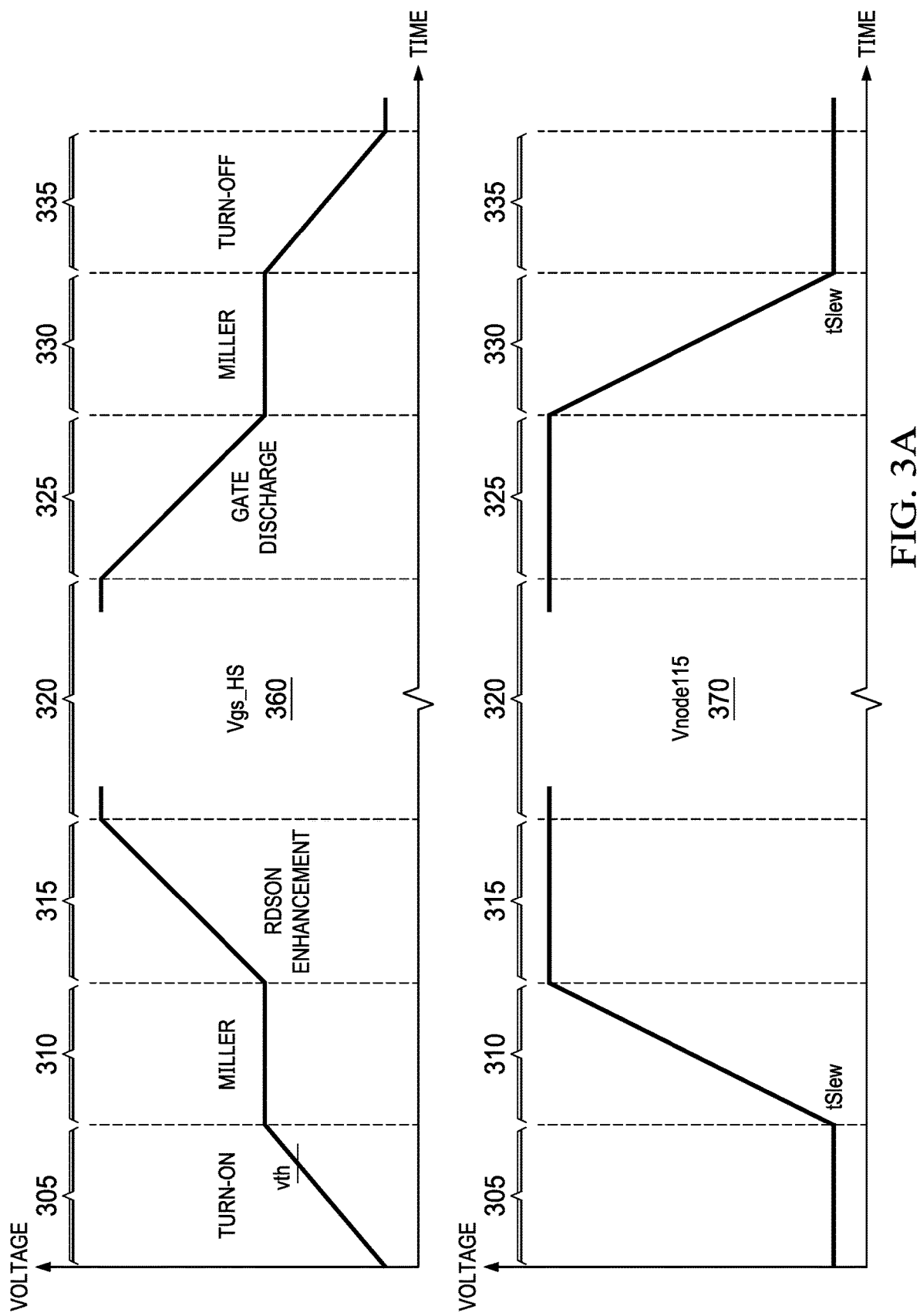
FIGS. 3A-B show the gate to source voltages of a high side transistor and a low side transistor, and the voltages on the output nodes of an example H bridge motor driver over time.

FIG. 3A shows the gate to source voltage Vgs_HS 360 and the voltage on node 115 Vnode115 370 of the high side transistor M_H1 in the example H bridge motor driver 100 over time. FIG. 3A is described in the context of M_H1 in H bridge motor driver 100, but high side transistor M_H3 or other high side transistors in other H bridge drivers will experience similar gate to source voltages and voltages on an output node. In regions 305-315, the transistor is turned on. In region 320, M_H1 is kept in an on state while in regions 325-335, the transistor is turned off. Region 305 is the transistor turn-on region, in which the gate to source capacitance Cgs of M_H1 is charged to the threshold voltage Vth. When Vgs_HS 360 is greater than Vth, the transistor conducts current. The ramp rate in region 305 is proportional to $$\frac{Idrive}{(Cgs + Cgd)},$$

where Idrive is the current applied to the gate terminal of the transistor and Cgd is the gate to drain capacitance of the transistor.

Region 310 is known as the Miller region, in which Vgs_HS 360 remains constant and Vnode115 370 increases as Cgd is charged. The length of time spent in region 310, tSlew, is proportional to $$\frac{Idrive}{Cgd}.$$

Because region 310 and the increasing Vnode115 370 can create EMI and noise in other circuits on the IC, tSlew and the corresponding drive current Idrive are determined according to the requirements of the IC and the amount of EMI other circuits on the IC can withstand. Once Cgd is charged, the conducting channel of M_H1 is fully enhanced by applying a higher gate drive voltage and drive current Idrive to the gate terminal in region 315, known as the RDSON enhancement region. The ramp rate in region 315 is proportional to $$\frac{Idrive}{(Cgs + Cgd)}.$$

Once Vgs_HS 360 reaches the on voltage of the transistor and enters region 320, M_H1 is in an on state.

When the transistor is turned off, Vgs_HS 360 decreases as the gate capacitance of the M_H1, Cgs+Cgd, is discharged to the Miller plateau level in region 325. The gate current is supplied by the gate capacitance and the ramp rate is proportional to $$\frac{Idrive}{Cgs + Cgd}.$$

once the gate voltage reaches the Miller plateau level, Vnode115 370 decreases as Cgd discharges further. The length of time spent in region 330, tSlew, is proportional to $$\frac{Idrive}{Cgd}.$$

As in region 310, region 330 and the decreasing Vnode115 370 can cause EMI and noise in other circuits on the IC. TSlew and the corresponding drive current are determined according to the requirements of the IC and the amount of EMI other circuits on the IC can withstand. In region 335, both Cgs and Cgd are discharged to zero volts, decreasing Vgs_HS 360 to zero volts and turning off the transistor. The ramp rate is proportional to $$\frac{Idrive}{(Cgs + Cgd)}.$$

To increase switching efficiency and optimize turn on, turn off, and the three regions of operation in each while maintaining the EMI caused during switching within the requirements of the IC, the drive current Idrive is varied in each region of operation. The varying drive current Idrive speeds transistor turn on in regions 305 and 315 and transistor turn off in regions 325 and 335 but carefully controls turn on and turn off speed in regions 310 and 330, such that the EMI created stays within acceptable limits for the IC.

Figure 3B:
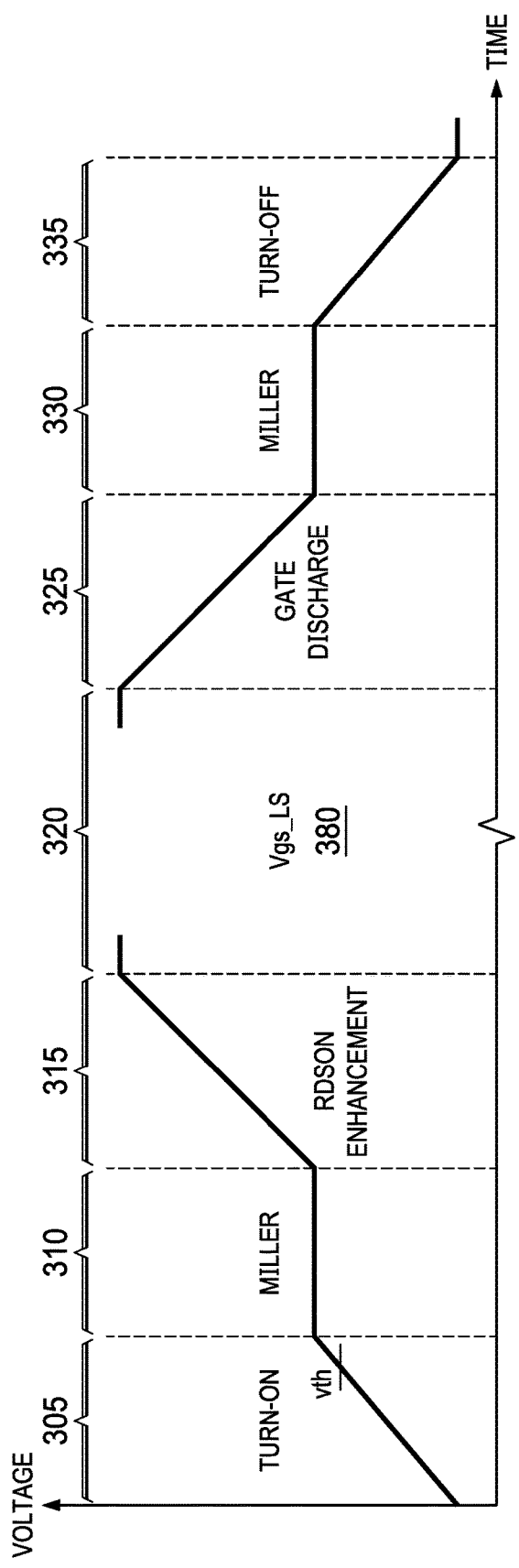
Figure 3B:
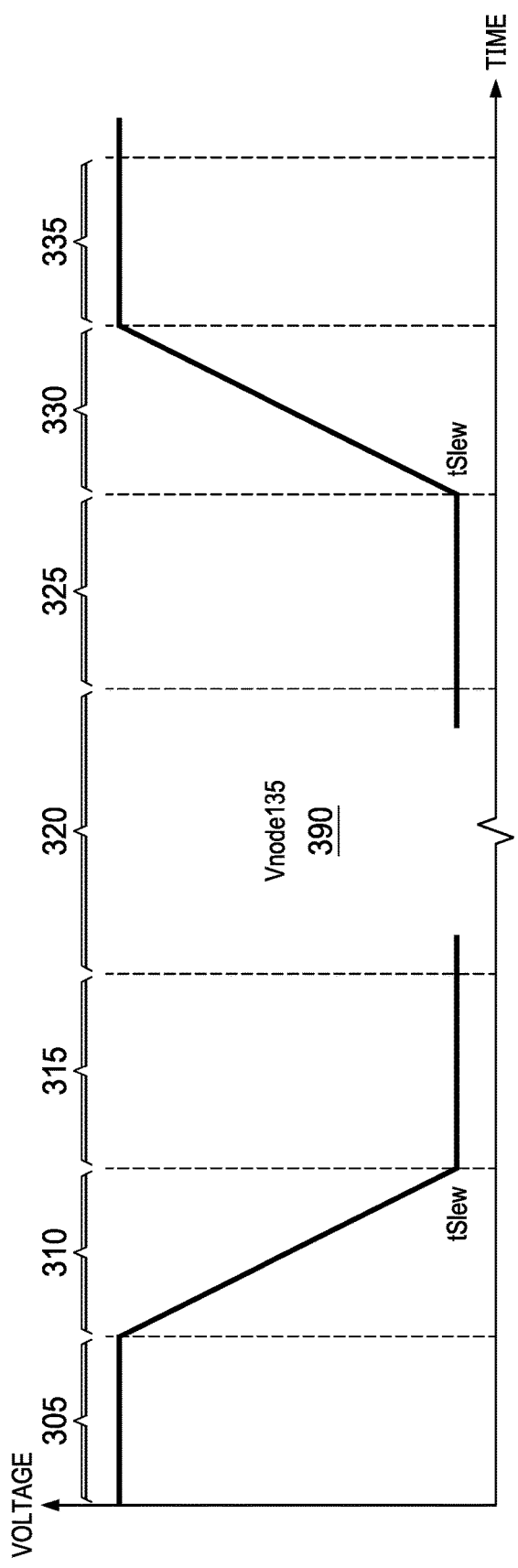

FIG. 3B shows the gate to source voltage Vgs_LS 380 and the voltage on node 135 Vnode135 390 of the low side transistor M_H4 in the example H bridge motor driver 100 over time. FIG. 3B is described in the context of M_H4 in H bridge motor driver 100, but low side transistor M_H2 or other low side transistors in other H bridge drivers will experience similar gate to source voltages and voltages on an output node. Just as in FIG. 3A, regions 305-315 correspond to transistor turn on. In region 320, M_H4 is kept in an on state while in regions 325-335, the transistor is turned off. Region 305 is the transistor turn-on region, in which the gate to source capacitance Cgs of M_H4 is charged to the threshold voltage Vth. When Vgs_LS 380 is greater than Vth, the transistor conducts current. The ramp rate in region 305 is proportional to $$\frac{Idrive}{(Cgs + Cgd)},$$

where Idrive is the current applied to the gate terminal of the transistor and Cgd is the gate to drain capacitance of the transistor.

Region 310 is known as the Miller region, in which Vgs_LS 380 remains constant and Vnode135 390 decreases as Cgd is charged. The length of time spent in region 310, tSlew, is proportional to $$\frac{Idrive}{Cgd}.$$

Because region 310 and the decreasing Vnode135 390 can create EMI and noise in other circuits on the IC, tSlew and the corresponding drive current Idrive are determined according to the requirements of the IC and the amount of EMI other circuits on the IC can withstand. Once Cgd is charged, the conducting channel of M_H4 is fully enhanced by applying a higher gate drive voltage and drive current Idrive to the gate terminal in region 315, known as the RDSON enhancement region. The ramp rate in region 315 is proportional to $$\frac{Idrive}{(Cgs+Cgd)}.$$

Once Vgs_LS 380 reaches the on voltage of the transistor and enters region 320, M_H4 is in an on state.

When the transistor is turned off, Vgs_LS 380 decreases as the gate capacitance of the M_H4, Cgs+Cgd, is discharged to the Miller plateau level in region 325. The gate current is supplied by the gate capacitance and the ramp rate is proportional to $$\frac{Idrive}{Cgs+Cgd}.$$

Once the gate voltage reaches the Miller plateau level, Vnode135 390 increases as Cgd discharges further. The length of time spent in region 330, tSlew, is proportional to $$\frac{Idrive}{Cgd}.$$

As in region 310, region 330 and the increasing Vnode135 390 can cause EMI and noise in other circuits on the IC. TSlew and the corresponding drive current are determined according to the requirements of the IC and the amount of EMI other circuits on the IC can withstand. In region 335, both Cgs and Cgd are discharged to zero volts, decreasing Vgs_LS 380 to zero volts and turning off the transistor. The ramp rate is proportional to $$\frac{Idrive}{(Cgs+Cgd)}.$$

To increase switching efficiency and optimize turn on, turn off, and the three regions of operation in each while maintaining the EMI caused during switching within the requirements of the IC, the drive current Idrive is varied in each region of operation just as in FIG. 3A for transistor M_H1. The varying drive current Idrive speeds transistor turn on in regions 305 and 315 and transistor turn off in regions 325 and 335 but carefully controls turn on and turn off speed in regions 310 and 330, such that the EMI created stays within acceptable limits for the IC.

Figure 4:
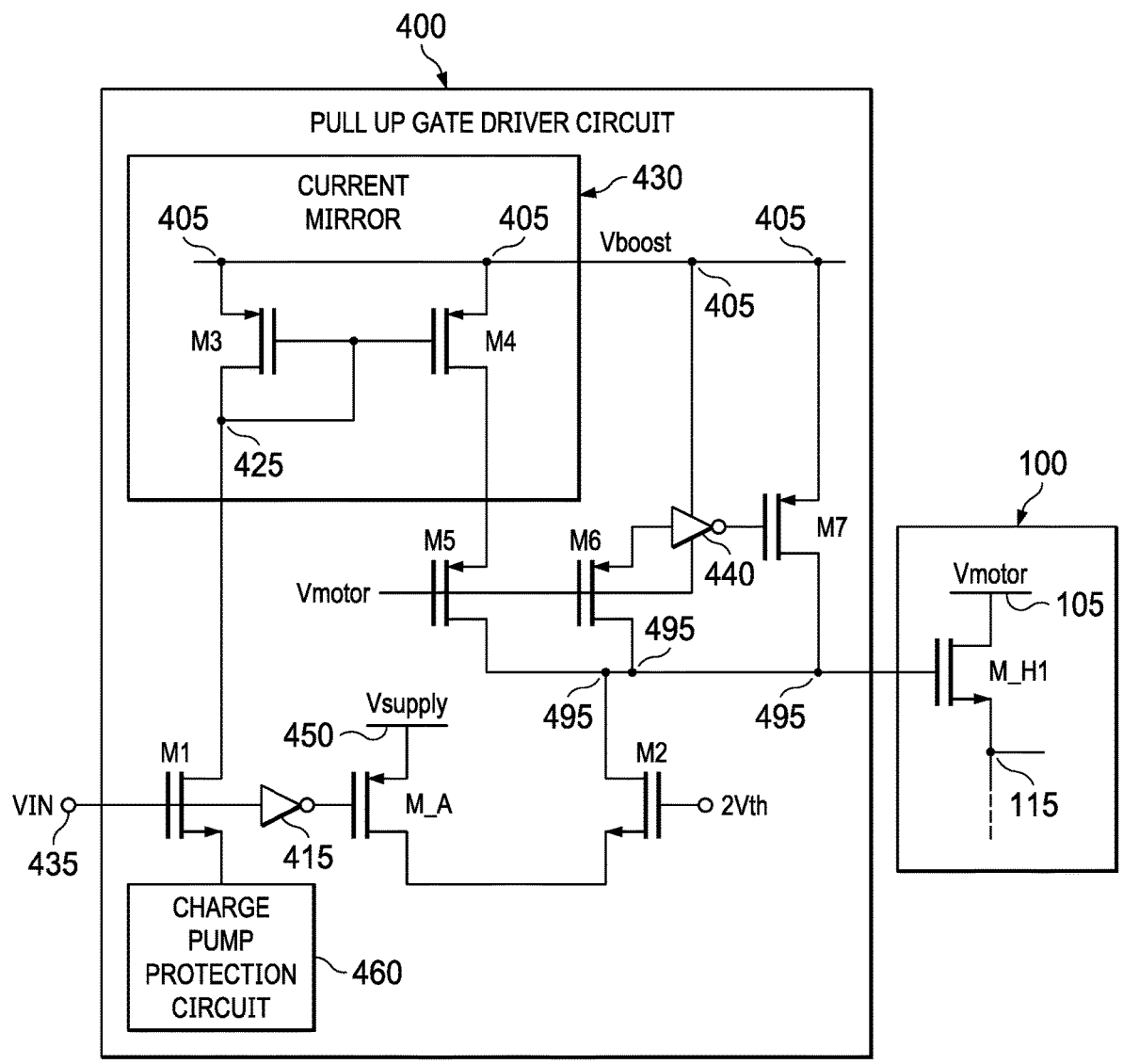
FIG. 4 illustrates an example pull-up gate driver circuit for a transistor in the example H bridge motor driver of FIG. 1.

FIG. 4 illustrates an example pull-up gate driver circuit 400 for a transistor in the example H bridge motor driver 100 of FIG. 1. Pull-up gate driver circuit 400 is shown in connection with M_H1 and gate driver circuit 110, but may be used in gate driver circuits 120, 130, and 140 as well. Pull-up gate driver circuit 400 includes NMOS transistors M1 and M2 and PMOS transistors M_A, M3, M4, M5, M6, and M7, as well as inverters 415 and 440. In other examples, one or more of M1 and M2 are PMOS transistors and one or more of M_A, M3, M4, M5, M6, and M7 are NMOS transistors. In other examples, one or more of M1, M2, M_A, M3, M4, M5, M6, and M7 are bipolar junction transistors.

Inverter 415 is configured to receive a control signal VIN 435 and coupled to the gate terminal of M_A. The source terminal of M_A is coupled to receive a supply voltage Vsupply at node 450 and the drain terminal of M_A is coupled to the source terminal of M2. In some examples, Vsupply is equal to Vmotor and to 5V. The gate terminal of M2 is configured to receive a biasing voltage equal to two times the threshold voltage Vth of M_H1 in this example. The drain terminal of M2 is coupled to output node 495 of pull-up gate driver circuit 400. When VIN 435 indicates M_H1 should be turned on, a logic low signal is applied to the gate terminal of M_A, causing M_A to turn on. M_A acts like a closed switch and allows a drive current Idrive to flow from the supply voltage on node 450 through M2 to output node 495 and by extension the gate terminal of M_H1 during region 305. M2 enters the cutoff region when the voltage on output node 495 is approximately Vth, acting like an open switch and disconnecting M_A and current from node 450 from output node 495. This transitions Vgs_HS 360 of M_H1 from region 305 to region 310.

The gate terminal of M1 is configured to receive VIN 435. The drain terminal of M1 is connected to the drain and gate terminals of M3 and the gate terminal of M4 at node 425. The source terminal of M1 is connected to charge pump protection circuit 460, which is configured to prevent a charge pump or boost converter coupled to node 405 from collapsing in the event of a short circuit at node 115. The source terminals of M3 and M4 are coupled to node 405 and configured to receive a charge pump or boost converter voltage Vboost. M3 and M4 function as current mirror 430. The drain terminal of M4 is coupled to the source terminal of M5. The gate terminal of M5 is configured to receive Vmotor and the drain terminal of M5 is coupled to output node 495. During region 310, current mirror 430 and M5 provide the drive current Idrive from the charge pump or boost converter to output node 495.

The gate terminal of M6 is configured to receive Vmotor and the drain terminal is coupled to output node 495. The source terminal is coupled to the input of inverter 440. Inverter 440 is coupled to the gate terminal of M7. The source terminal of M7 is coupled to node 405 and configured to receive a charge pump or boost converter voltage Vboost. The drain terminal of M7 is coupled to output node 495. During region 310, M6 compares the voltage on output node 495, its drain terminal, to Vmotor, applied to its gate terminal. When the voltage on output node 495 exceeds Vmotor, M6 turns on and the source terminal of M6 has the same voltage as the voltage on output node 495, causing the input to inverter 440 to be logic high. Inverter 440 converts the logic high signal to a logic low signal and applies it to the gate terminal of M7, causing M7 to turn on and act as a closed switch. This ends region 310 and transitions Vgs_HS 360 into region 315. M7 allows additional current to flow from Vboost on node 405 to output node 495, increasing the drive current Idrive applied to the gate terminal of M_H1. When Vgs_HS 360 reaches the on voltage of M_H1, pull-up of M_H1 is complete and M_H1 is on.

Figure 5:
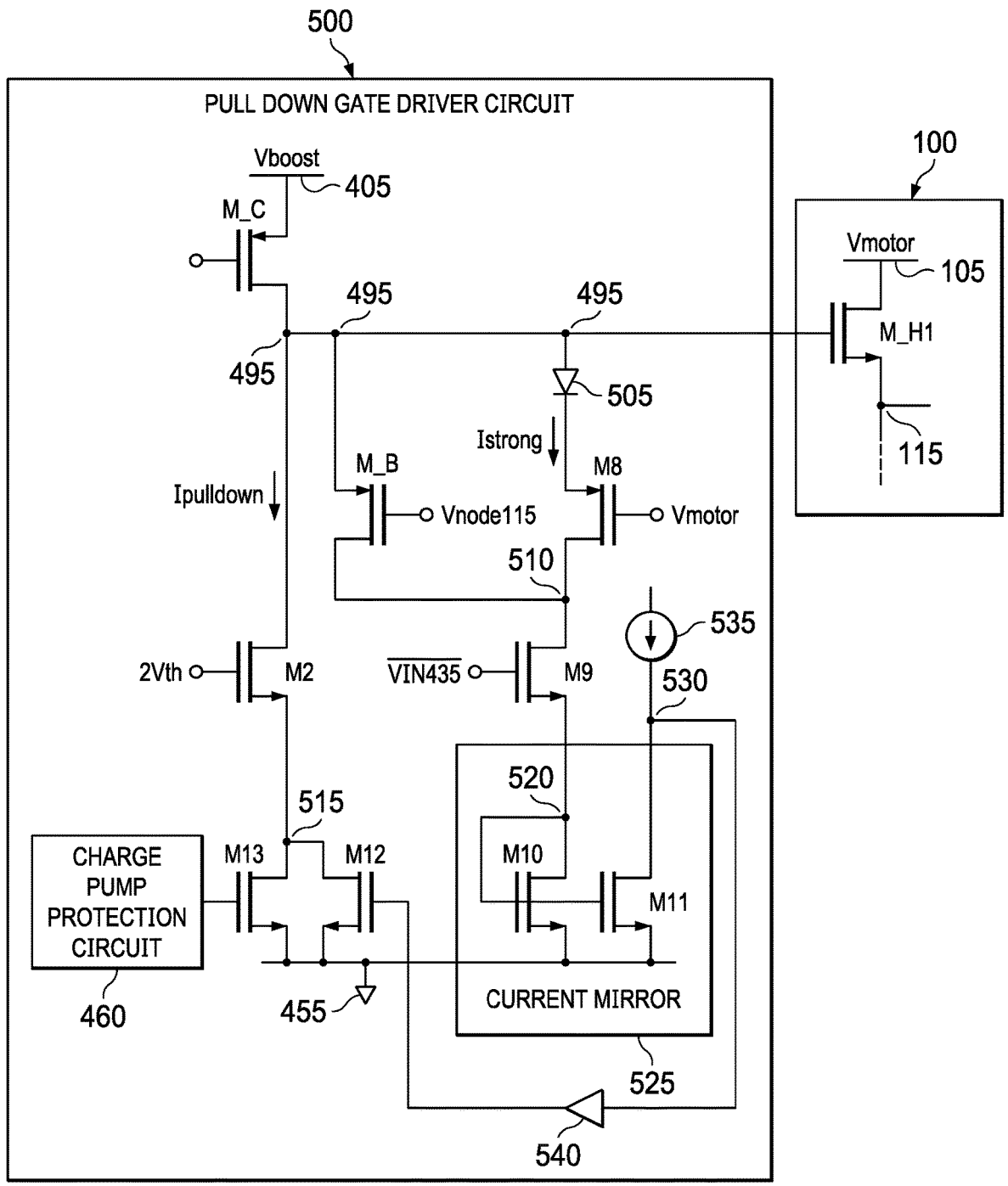
FIG. 5 illustrates an example pull-down gate driver circuit for a transistor in the example H bridge motor driver of FIG. 1.

FIG. 5 illustrates an example pull-down gate driver circuit 500 for a transistor in the example H bridge motor driver 100 of FIG. 1. Pull-down gate driver circuit 500 is shown in connection with M_H1 and gate driver circuit 110, but may be used in gate driver circuits 120, 130, and 140 as well. Pull-down gate driver circuit 500 includes NMOS transistors M2, M9, M10, M11, M12, and M13 and PMOS transistors M_B, M_C, and M8, as well as diode 505, current source 535, and buffer 540. In other examples, one or more of M2, M9, M10, M11, M12, and M13 are PMOS transistors and one or more of M_B, M_C, and M8 are NMOS transistors. In other examples, one or more of M2, M_B, M_C, M8, M9, M10, M11, M12, and M13 are bipolar junction transistors.

M_C is coupled to node 405 and output node 495, and configured to receive a voltage biasing it in the off state and acting as an open switch, disconnecting Vboost on node 450 from output node 495. Diode 505 is coupled to output node 495 and the source terminal of M8. The gate terminal of M8 is configured to receive Vmotor and the drain terminal of M8 is coupled to the drain terminals of M_B and M9 at node 510. The gate terminal of M_B is configured to receive the voltage on node 115 and the source terminal of M_B is coupled to output node 495. The gate terminal of M9 is configured to receive VIN 435 and the source terminal of M9 is coupled to the gate terminals of M10 and M11 and the drain terminal of M10 at node 520. The source terminals of M10 and M11 are coupled to common mode node 455. The drain terminal of M11 is coupled to the output of current source 535 and the input of buffer 540 at node 530. M10 and M11 function as current mirror 525. The output of buffer 540 is coupled to the gate terminal of M12.

The drain terminal of M2 is connected to the drain terminal of M_C at output node 495 and the source terminal of M2 is connected to the drain terminals of M12 and M13 at node 515. The gate terminal of M2 is configured to receive a biasing voltage to keep it on and acting as a closed switch, in this example two times the threshold voltage of M_H1. The source terminals of M12 and M13 are coupled to common mode node 455. The gate terminal of M13 is biased as current source by the charge pump protection circuit 460. The gate terminal of M12 is coupled to the output of buffer 540. During turn off, the gate terminal of M13 receives a signal biasing it to keep it on and acting as a closed switch. This creates a path for Ipulldown current through M2 and M13 to common mode node 455.

When VIN 435 indicates M_H1 should be turned off, Ipulldown current flows through M2 and M13 to common mode node 455 and Istrong current flows through diode 505, M8, M9, and M10 to common mode node 455, decreasing Vgs_HS 360 during region 325. While Istrong current flows through M10 in current mirror 525, M11 acts as a closed switch and causes the current from current source 535 to flow through M11 to common mode node 455. This causes the voltage on node 530 input to buffer 540 to be a logic low signal. This logic low signal is supplied to the gate terminal of M12, keeping it in an off state and acting as an open switch.

As the voltage on output node 495 approaches Vmotor plus Vth plus the voltage across diode 505, Istrong current through M8 approaches zero and Ipulldown current remains steady. This provides a substantially constant pulldown current to output node 495 and the gate terminal of M_H1, allowing the voltage on node 115 to decrease at a rate appropriate for the EMI requirements of the IC and causing Vgs_HS 360 to transition from region 325 to region 330. When Vgs_HS 360 decreases below Vmotor plus Vth plus the voltage across diode 505, it has transitioned from region 330 to region 335 and M8 is turned off, acting as an open switch such that no current flows through M9 to current mirror 525. This allows the voltage on node 530 to increase and current source 535 to provide its current to the input of buffer 540. This causes the input to and output from buffer 540 to be a logic high signal. The logic high signal is supplied to the gate terminal of M12, causing it to turn on and act as a closed switch. This creates another path for current to flow through, increasing Ipulldown current and speeding the decrease in Vgs_HS 360 during region 335. When Vgs_HS 360 becomes zero volts, M_H1 is fully turned off.

Figure 6:
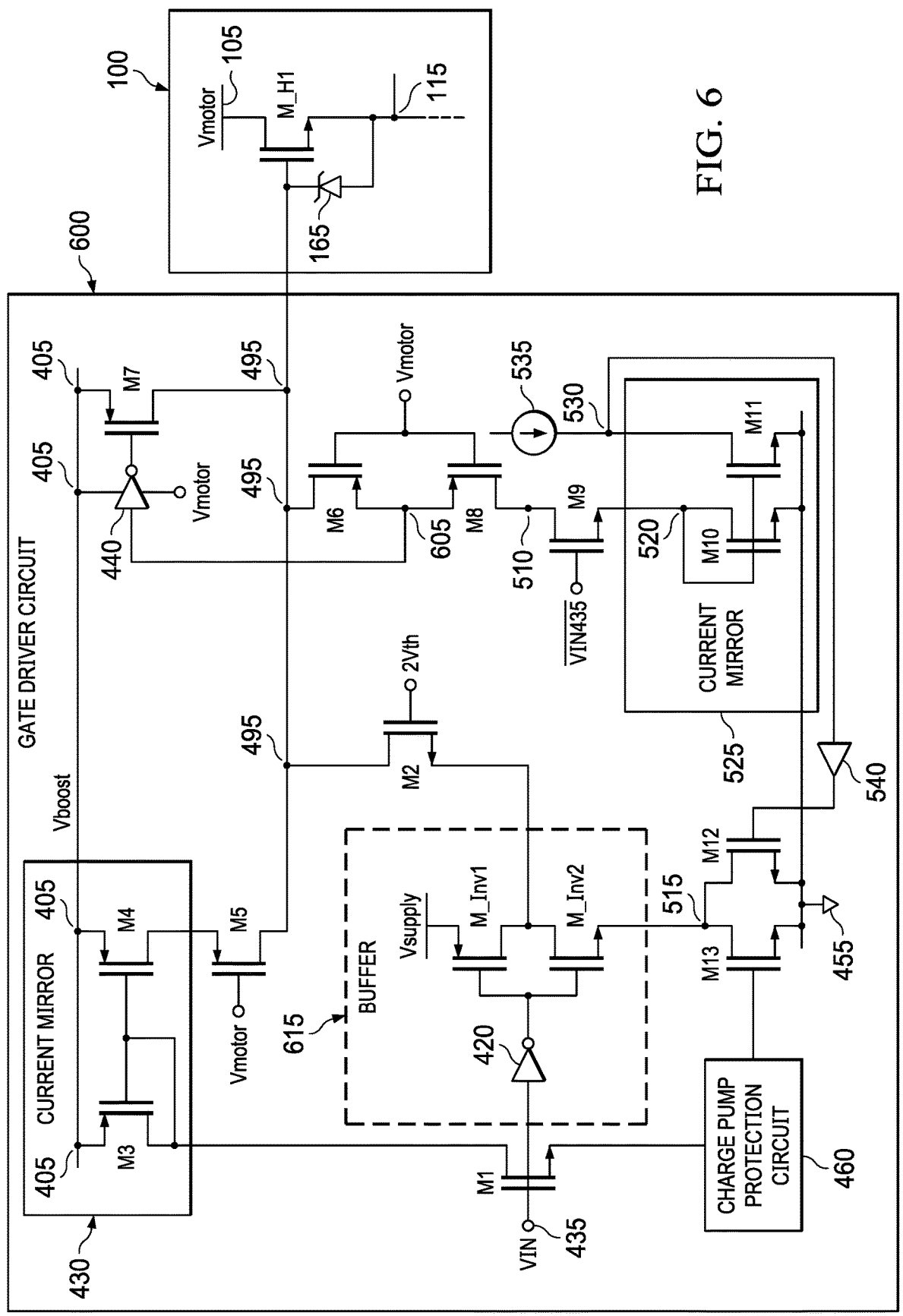
FIG. 6 illustrates an example gate driver circuit for a transistor in the example H bridge motor driver of FIG. 1.

FIG. 6 illustrates an example gate driver circuit 600 for a transistor in the example H bridge motor driver 100 of FIG. 1, combining the features of pull-up gate driver circuit 400 and pull-down gate driver circuit 500. Gate driver 600 is shown in connection with M_H1 and gate driver circuit 110, but may be used in gate driver circuits 120, 130, and 140 as well. Gate driver circuit 600 includes NMOS transistors M1, M2, M9, M10, M11, M12, and M13 and PMOS transistors M3, M4, M5, M6, M7, and M8, as well as inverter 440, current source 535, and buffers 615 and 540. Only M6 and M7 are high voltage PMOS with high gate capacitance, occupying a relatively large area on the IC. The remaining transistors are small, low power FETs. In other examples, one or more of M1, M2, M9, M10, M11, M12, and M13 are PMOS transistors and one or more of M3, M4, M5, M6, M7, and M8 are NMOS transistors. In other examples, one or more of M1, M2, M3, M4, M5, M6, M7, M8, M9, M10, M11, M12, and M13 are bipolar junction transistors.

Buffer 615 is configured to receive VIN 435 and is coupled to the source terminal of M2 and the drain terminal of M13. In this example, buffer 615 includes complementary MOSFET inverters. An inverter 420 is configured to receive VIN 435 and is coupled to the gate terminals of PMOS transistor M_Inv1 and NMOS transistor M_Inv2. The source terminal of M_Inv1 is coupled to a supply voltage Vsupply, which in some examples is equal to Vmotor and to 5V. The drain terminal of M_Inv1 is coupled to the drain terminal of M_Inv2. The source terminal of M_Inv2 is coupled to the drain terminal of M13 at node 515. The source terminal of M2 is coupled to the drain terminals of M_Inv1 and M_Inv2. In gate driver circuit 600, M_Inv1 acts as M_A in pull-up gate driver circuit 400 in FIG. 4.

The gate terminal of M2 is configured to receive a biasing voltage equal to two times the threshold voltage Vth of M_H1 in this example, and the drain terminal of M2 is coupled to output node 495 of gate driver circuit 600. When VIN 435 indicates M_H1 should be turned on, buffer 615 allows a drive current Idrive to flow from the supply voltage through M_Inv1 and M2 to output node 495 and by extension the gate terminal of M_H1 during region 305. M2 turns off when the voltage on output node 495 is approximately Vth, acting like an open switch and disconnecting buffer 615 and current from its power supply from output node 495. This transitions Vgs_HS 360 of M_H1 from region 305 to region 310.

The gate terminal of M1 is configured to receive VIN 435. The drain terminal of M1 is connected to the drain and gate terminals of M3 and the gate terminal of M4 at node 425. The source terminal of M1 is connected to charge pump protection circuit 460, which is configured to prevent a charge pump or boost converter coupled to node 405 from collapsing in the event of a short circuit at node 115. The source terminals of M3 and M4 are coupled to node 405 and configured to receive a charge pump or boost converter voltage Vboost. M3 and M4 function as current mirror 430. The drain terminal of M4 is coupled to the source terminal of M5. The gate terminal of M5 is configured to receive Vmotor and the drain terminal of M5 is coupled to output node 495. During region 310, current mirror 430 and M5 provide the drive current Idrive to output node 495.

The gate terminal of M6 is configured to receive Vmotor and the drain terminal of M6 is coupled to output node 495.

The source terminal is coupled to the input of inverter 440 at node 605. Inverter 440 is coupled to the gate terminal of M7. The source terminal of M7 is coupled to node 405 and configured to receive a charge pump or boost converter voltage Vboost. The drain terminal of M7 is coupled to output node 495. During region 310, M6 compares the voltage on output node 495, its drain terminal, to Vmotor, applied to its gate terminal.

When the voltage on output node 495 exceeds Vmotor, M6 turns on and the current input to inverter 440 from the source terminal of M6 goes logic high. Inverter 440 converts the logic high signal to a logic low signal and applies the logic low signal to the gate terminal of M7, causing M7 to turn on and act as a closed switch. This ends region 310 and transitions Vgs_HS 360 into region 315. M7 allows additional current to flow from Vboost on node 405 to output node 495, increasing the drive current Idrive applied to the gate terminal of M_H1 and speeding the increase of Vgs_HS 360 during region 315. When Vgs_HS 360 reaches the on voltage of M_H1, pull-up of M_H1 is complete and M_H1 is on.

M_H1 is kept on during region 320 by M7, which maintains Vboost on output node 495. In the event of a short circuit on node 115, the voltage on output node 495 and the drain terminal of M6 will decrease rapidly, causing M6 to turn off and the input to inverter 440 to be logic low. Inverter 440 converts the logic low signal to a logic high signal and applies it to the gate terminal of M7, causing M7 to turn off. This causes M7 to act as an open switch and disconnects the charge pump from output node 495 and the short circuit. Any short circuit current from charge pump before M7 disconnects it from output node 495 is absorbed by a Zener diode 165 in H bridge motor driver circuit 100, which is connected to the gate and source terminals of M_H1. M_H2, M_H3, and M_H4 each have a Zener diode 165 coupled to their respective gate and source terminals.

The source terminal of M8 is coupled to the source terminal of M6 and the input to inverter 440 at node 605. In gate driver circuit 600, M6 acts as diode 505 in pull-down gate driver circuit 500. The gate terminal of M8 is configured to receive Vmotor and the drain terminal of M8 is coupled to the drain terminal of M9 at node 510. The gate terminal of M9 is configured to receive VIN 435 and the source terminal of M9 is coupled to the gate terminals of M10 and M11 and the drain terminal of M10 at node 520. The source terminals of M10 and M11 are coupled to common mode node 455. The drain terminal of M11 is coupled to the output of current source 535 and the input of buffer 540 at node 530. M10 and M11 function as current mirror 525.

The drain terminals of M12 and M13 are coupled to the source terminal of M_Inv2 at node 515 and the source terminals of M12 and M13 are coupled to common mode node 455. The gate terminal of M13 is coupled to the shoot-through protection circuit 460. The gate terminal of M12 is coupled to the output of buffer 540. During turn off, the gate terminal of M13 receives a signal biasing it on and acting as a closed switch. This creates a path for Ipulldown current from output node 495 to common mode node 455.

When VIN 435 indicates M_H1 should be turned off, Ipulldown current flows through M2, M_Inv2, and M13 to common mode node 455 and Istrong current flows through M6, M8, M9, and M10 to common mode node 455, decreasing Vgs_HS 360 during region 325. In gate driver circuit 600, M_Inv2 acts as M_B in pull-down gate driver circuit 500 and M6 acts as diode 505 in pull-down gate driver circuit 500. While Istrong current flows through M10 in current mirror 525, M11 acts as a closed switch and causes the current from current source 535 to flow through M11 to common mode node 455. This causes the voltage on node 530 input to buffer 540 to be a logic low signal. This logic low signal is supplied to the gate terminal of M12, keeping it in an off state and acting as an open switch.

As the voltage on output node 495 approaches Vmotor plus Vth, Istrong current through M8 approaches zero while Ipulldown current remains steady. This provides a substantially constant drive current to output node 495 and the gate terminal of M_H1, allowing the voltage on node 115 to decrease at a rate appropriate for the EMI requirements of the IC and causing Vgs_HS 360 to transition from region 325 to region 330. When Vgs_HS 360 decreases below Vmotor plus Vth, it has transitioned from region 330 to region 335 and M8 transitions into the cut off region, acting as an open switch such that Istrong current is zero and no current flows through M9 to current mirror 525. This allows current source 535 to provide current to the input of buffer 540, causing the input to and output from buffer 540 to be a logic high signal. The logic high signal is supplied to the gate terminal of M12, causing it to turn on and act as a closed switch. This creates another path for current to flow through, increasing Ipulldown current and speeding the decrease in Vgs_HS 360 during region 335. When Vgs_HS 360 becomes zero volts, M_H1 is fully turned off.

Gate driver circuit 600 is area efficient, in that it includes only two large area, high voltage transistors M6 and M7. Reuse of M2 in pull-up region 305 and pull-down regions 325-335 and reuse of M6 as a comparator in regions 315 and 325 reduces the area requirements of gate driver circuit 600 while allowing it to detect the regions of operation and increase or decrease drive current Idrive accordingly. The changing drive current Idrive reduces propagation delay as M_H1 turns on and off and the corresponding dead time without generating problematic EMI and disrupting operation of other circuits in the IC.

Figure 7:
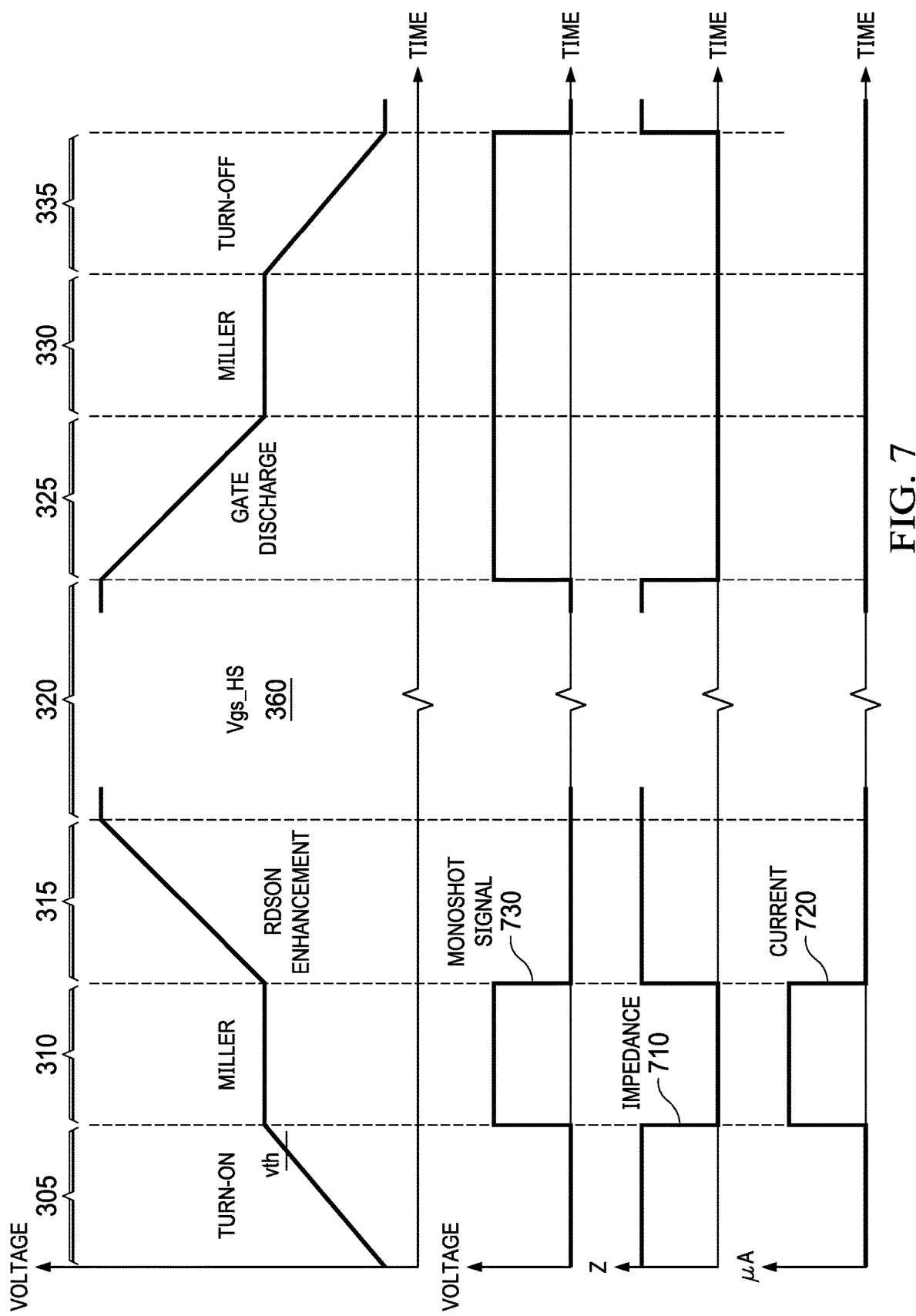
FIG. 7 shows the gate to source voltage of a transistor in an example H bridge motor driver, the impedance seen by an example gate driver circuit due to a charge pump protection circuit, the current input to and output by a current mirror within the example gate driver circuit, and a mono-shot signal from the charge pump protection circuit over time.

As discussed previously, gate driver circuit 600 receives two inputs from charge pump protection circuit 460. One input is supplied to the source terminal of M1 during region 310 and increases current supplied by current mirror 430. Another input is supplied to the gate terminal of M13 during turn off and biases M13 on and acting as a closed switch. FIG. 7 illustrates Vgs_HS 360, the impedance 710 seen at the source terminal of M1 from the charge pump protection circuit 460, the current 720 input to and output by current mirror 430, and the mono-shot signal 730 from charge pump protection circuit 460 applied to the gate terminal of M13 over time.

During regions 305 and 315, the impedance 710 from charge pump protection circuit 460 is greater than during region 310. The decreased impedance 710 in region 310 increases the current 720 input to and output by current mirror 430. This increased current 720 is solely responsible for the drive current supplied to output node 495 during region 310 and is chosen such that the slew rate complies with EMI requirements of the IC. Increasing and maintaining the increased impedance 710 before and after region 310 reduces the current drawn from the charge pump. As explained previously, in the event of a short circuit on node 115, M6 and M8 automatically disconnect the charge pump from output node 495 while the increased impedance from charge pump protection circuit 460 carefully controls the current 720 drawn from the charge pump by current mirror 430, preventing charge pump collapse.

In some charge pump protection circuits, the mono-shot signal 730 is applied to the gate terminals of one or more transistors within the charge pump protection circuit. During region 310, mono-shot signal 730 is logic high and causes the one or more transistors within the charge pump protection circuit to be on and to act as closed switches, decreasing the impedance 710 from the charge pump protection circuit 460. While this also causes M13 to act as a closed switch, M13 is disconnected from output node 495 because M_Inv2 is off and acts as an open switch. During regions 325-335, mono-shot signal 730 is logic high, biasing M13 on and acting as a closed switch. M_Inv2 is also on and acting as a closed switch. This creates a path for Ipulldown current. While this also causes the impedance 710 from the charge pump protection circuit 460 to decrease, M1 is off and acts as an open switch, so no additional current 720 is drawn from the charge pump.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A driver circuit comprising:
   a first transistor;
   a first circuit including:
      second and third transistors; and
      a first inverter coupled between respective control inputs of the first and second transistors;
   a second circuit including:
      a current mirror coupled to the first transistor; and
      a fourth transistor coupled to the current mirror and the third transistor; and
   a third circuit including:
      a fifth transistor coupled to the third and fourth transistors;
      a sixth transistor coupled to the current mirror and to the third, fourth, and fifth transistors; and
      a second inverter coupled between the fifth and sixth transistors.

2. The driver circuit of claim 1, wherein the first through sixth transistors are field-effect transistors (FETs).

3. The driver circuit of claim 2, wherein the first and third transistors are n-type FETs, and the second, fourth, fifth, and sixth transistors are p-type FETs.

4. The driver circuit of claim 2, wherein the first and third transistors are p-type FETs, and the second, fourth, fifth, and sixth transistors are n-type FETs.

5. The driver circuit of claim 1, wherein the first through sixth transistors are bipolar junction transistors.

6. The driver circuit of claim 1, wherein:
   the first through sixth transistors each include, a respective control input and respective first and second terminals;
   the first terminal of the first transistor is coupled to the current mirror;
   the first terminal of the fourth transistor is coupled to the current mirror, and the second terminal of the fourth transistor is coupled to the respective first terminals of the third, fifth, and sixth transistors; and
   the second terminal of the sixth transistor is coupled to the current mirror.

7. The driver circuit of claim 6, wherein:
   the first and second inverters each have a respective input and a respective output;
   the input of the first inverter is coupled to the control input of the first transistor, and the output of the first inverter is coupled to the control input of the second transistor; and
   the input of the second inverter is coupled to the second terminal of the fifth transistor, and the output of the second inverter is coupled to the control input of the sixth transistor.

8. The driver circuit of claim 7, wherein the first terminal of the second transistor is coupled to the second terminal of the third transistor.

9. The driver circuit of claim 1, wherein:
   the first transistor and the first circuit are configured to provide a first drive signal for a seventh transistor in a first region of operation, wherein the first drive signal is provided responsive to a first control signal at the control input of the first transistor and a second control signal at a respective control input of the third transistor;
   the first transistor and the second circuit are configured to provide a second drive signal for the seventh transistor in a second region of operation, wherein the second drive signal is provided responsive to the first control signal and a third control signal at a respective control input of the fourth transistor; and
   the third circuit is configured to provide a third drive signal for the seventh transistor in a third region of operation, wherein the third drive signal is provided responsive to the third control signal at a respective control input of the fifth transistor.

10. A circuit comprising:
   a first transistor having a control input and first and second terminals;
   second and third transistors, each having a respective control input and respective first and second terminals;
   a first inverter coupled between the control inputs of the first and second transistors;
   a current mirror coupled to the first terminal of the first transistor;
   a fourth transistor having a respective control input and respective first and second terminals, wherein the first terminal of the fourth transistor is coupled to the current mirror, and the second terminal of the fourth transistor is coupled to the first terminal of the third transistor;
   a fifth transistor having a respective control input and respective first and second terminals, wherein the first terminal of the fifth transistor is coupled to the second terminal of the fourth transistor and the first terminal of the third transistor;
   a sixth transistor having a respective control input and respective first and second terminals, wherein the first terminal of the sixth transistor is coupled to the second terminal of the fourth transistor and the respective first terminals of the third and fifth transistors, and the second terminal of the sixth transistor is coupled to the current mirror; and
   a second inverter coupled between the fifth and sixth transistors.

11. The circuit of claim 10, wherein:
   the first and second inverters each have a respective input and a respective output;

the input of the first inverter is coupled to the control input of the first transistor, and the output of the first inverter is coupled to the control input of the second transistor; and the input of the second inverter is coupled to the second terminal of the fifth transistor, and the output of the second inverter is coupled to the control input of the sixth transistor.

12. The circuit of claim 11, wherein the first terminal of the second transistor is coupled to the second terminal of the third transistor.

13. The circuit of claim 10, wherein the first through sixth transistors are field-effect transistors (FETs).

14. The circuit of claim 13, wherein the first and third transistors are n-type FETs, and the second, fourth, fifth, and sixth transistors are p-type FETs.

15. The circuit of claim 13, wherein the first and third transistors are p-type FETs, and the second, fourth, fifth, and sixth transistors are n-type FETs.

16. The circuit of claim 10, wherein the first through sixth transistors are bipolar junction transistors.

17. A circuit comprising:
a first field-effect transistor (FET) having a gate and first and second terminals;
second and third FETs, each having a respective gate and respective first and second terminals;
a first inverter having a first inverter input coupled to the gate of the first FET and a first inverter output coupled to the gate of the second FET;
a current mirror coupled to the first terminal of the first FET;
a fourth FET having a respective gate and respective first and second terminals, wherein the first terminal of the fourth FET is coupled to the current mirror, and the second terminal of the fourth FET is coupled to the first terminal of the third FET;
a fifth FET having a respective gate and respective first and second terminals, wherein the first terminal of the fifth FET is coupled to the second terminal of the fourth FET and the first terminal of the third FET;
a sixth FET having a respective gate and respective first and second terminals, wherein the first terminal of the sixth FET is coupled to the second terminal of the fourth FET and the respective first terminals of the third and fifth FETs, and the second terminal of the sixth FET is coupled to the current mirror; and
a second inverter having a second inverter input coupled to the second terminal of the fifth FET and a second inverter output coupled to the gate of the sixth FET.

18. The circuit of claim 17, wherein the first terminal of the second FET is coupled to the second terminal of the third FET.

19. The circuit of claim 17, wherein the first and third FETs are n-type field-effect FETs, and the second, fourth, fifth, and sixth FETs are p-type FETs.

20. The circuit of claim 17, wherein the first and third FETs are p-type field-effect FETs, and the second, fourth, fifth, and sixth FETs are n-type FETs.

* * * * *